(12) United States Patent
Lee et al.

(10) Patent No.: US 8,865,594 B2
(45) Date of Patent: Oct. 21, 2014

(54) FORMATION OF LINER AND BARRIER FOR TUNGSTEN AS GATE ELECTRODE AND AS CONTACT PLUG TO REDUCE RESISTANCE AND ENHANCE DEVICE PERFORMANCE

(75) Inventors: Sang-Hyeob Lee, Saratoga, CA (US); Sang Ho Yu, Cupertino, CA (US); Kai Wu, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 126 days.

(21) Appl. No.: 13/415,727

(22) Filed: Mar. 8, 2012

(65) Prior Publication Data

US 2012/0231626 A1 Sep. 13, 2012

Related U.S. Application Data

(60) Provisional application No. 61/451,441, filed on Mar. 10, 2011.

(51) Int. Cl.
| | | |
|---|---|---|
| H01L 21/44 | (2006.01) | |
| C23C 16/455 | (2006.01) | |
| H01L 21/285 | (2006.01) | |
| C23C 16/56 | (2006.01) | |
| H01L 21/768 | (2006.01) | |
| C23C 16/02 | (2006.01) | |
| C23C 16/34 | (2006.01) | |
| H01L 27/108 | (2006.01) | |

(52) U.S. Cl.
CPC ....... *C23C 16/0272* (2013.01); *C23C 16/45529* (2013.01); *H01L 27/10891* (2013.01); *H01L 21/28556* (2013.01); *C23C 16/56* (2013.01); *H01L 21/76846* (2013.01); *C23C 16/34* (2013.01)

USPC ........... 438/656; 438/643; 438/648; 438/649; 438/653; 438/654; 438/655; 438/666; 438/683; 257/E21.584; 257/E21.165; 257/E23.163; 257/751

(58) Field of Classification Search
CPC ................... H01L 21/76877; H01L 21/76856; H01L 21/76879; H01L 21/76883; H01L 29/4236
USPC ......... 438/643, 648, 649, 653–656, 666, 683; 257/E21.584, E21.165, E23.163, 751
See application file for complete search history.

(56) References Cited

U.S. PATENT DOCUMENTS

| | | | |
|---|---|---|---|
| 5,733,816 A * | 3/1998 | Iyer et al. | 438/592 |
| 6,423,619 B1 * | 7/2002 | Grant et al. | 438/589 |
| 8,053,341 B2 * | 11/2011 | Kim | 438/514 |
| 8,197,275 B2 * | 6/2012 | Kim | 439/243 |
| 2002/0137356 A1 * | 9/2002 | Huang et al. | 438/740 |
| 2005/0266684 A1 * | 12/2005 | Lee et al. | 438/653 |
| 2006/0264038 A1 * | 11/2006 | Kato | 438/656 |
| 2009/0032949 A1 * | 2/2009 | Goswami | 257/741 |
| 2009/0045517 A1 * | 2/2009 | Sugiura et al. | 257/770 |
| 2009/0072288 A1 * | 3/2009 | Hanson et al. | 257/296 |
| 2009/0081866 A1 * | 3/2009 | Lee et al. | 438/655 |

(Continued)

*Primary Examiner* — Bac Au
(74) *Attorney, Agent, or Firm* — Patterson & Sheridan, LLP

(57) ABSTRACT

The invention provides a method of forming a film stack on a substrate, comprising performing a silicon containing gas soak process to form a silicon containing layer over the substrate, reacting with the silicon containing layer to form a tungsten silicide layer on the substrate, depositing a tungsten nitride layer on the substrate, subjecting the substrate to a nitridation treatment using active nitrogen species from a remote plasma, and depositing a conductive bulk layer directly on the tungsten nitride layer.

17 Claims, 5 Drawing Sheets

(56) References Cited

U.S. PATENT DOCUMENTS

| | | | |
|---|---|---|---|
| 2009/0163025 A1* | 6/2009 | Humayun et al. | 438/675 |
| 2009/0239376 A1* | 9/2009 | Sung et al. | 438/643 |
| 2009/0280640 A1* | 11/2009 | Khandelwal et al. | 438/653 |
| 2011/0059608 A1* | 3/2011 | Gao et al. | 438/654 |
| 2011/0233778 A1* | 9/2011 | Lee et al. | 257/751 |

* cited by examiner

FORMATION OF LINER AND BARRIER FOR TUNGSTEN AS GATE ELECTRODE AND AS CONTACT PLUG TO REDUCE RESISTANCE AND ENHANCE DEVICE PERFORMANCE

CROSS REFERENCE TO RELATED APPLICATIONS

This application claims benefit of U.S. Provisional Patent Application No. 61/451,441, filed Mar. 10, 2011, which is incorporated by reference in its entirety.

BACKGROUND OF THE INVENTION

1. Field of the Invention

Embodiments of the present invention generally relate to a method and improved film stacks for contact plug or gate electrode used in semiconductor applications.

2. Description of the Related Art

Tungsten-containing films are typically used in multiple applications for semiconductor device fabrication. For example, metallic tungsten (W) has been a primary conductor for contacts and vias. Metallic tungsten is also used in bit lines. The typical film stack currently in use is Ti/TiN nucleation/CVD-W bulk, with the titanium (Ti)/titanium nitride (TiN) layers acting as liner or barrier films.

While titanium tetrachloride ($TiCl_4$)-based TiN processes provide improved step coverage, the deposition is usually performed at temperatures much greater than 400° C., which is incompatible with many device integration processes. Meanwhile, various issues arise with depositing and using TiN films, especially as feature sizes decrease. One problem with TiN is that TiN has poor diffusion resistance, so that halide elements such as Cl (in CVD-TiN with $TiCl_4$) and F (in CVD-W bulk with $WF_6$) may diffuse into the device during subsequent thermal processing, thereby adversely increasing resistivity of the film and cause interface issues. In addition, as circuit densities increase, the widths of vias, contacts and other features have been decreased to sub-micron dimensions less than 40 nm or 30 nm, leaving limited or no space for low resistance CVD W bulk since the feature is already filled with CVD-TiN and high resistive CVD W nucleation layer. However, in the conventional TiN liner/barrier approach, CVD W bulk film does not grow on CVD-TiN unless a nucleation layer is deposited thereon first as a growth site for W bulk film.

Furthermore, as the barrier layers and liner layers formed in the interconnection line are typically formed on a dielectric layer, poor adhesion of the barrier layer and liner layers to the dielectric layer may result in film peeling and high contact resistivity, thereby adversely resulting in device failure and poor electrical performance.

Therefore, there is a need in various device integration processes for an improved integrated film stack with good barrier properties and reduced film stack resistivity while providing more room for subsequent low resistance gate metallization process.

SUMMARY OF THE INVENTION

The present invention generally provides a method of forming a film stack on a substrate, comprising performing a silicon containing layer soaking process prior to the barrier layer deposition process. One aspect of the present invention provides a method of fabricating a buried word line (bWL) feature used in a dynamic random access memory (DRAM), comprising providing a substrate comprising a trench structure having sidewalls and a bottom, the sidewalls and the bottom being covered with a dielectric layer, exposing the substrate to a silicon containing gas to form a silicon containing layer, subsequently, supplying a first processing gas comprising nitrogen and a second processing gas comprising a tungsten to form a tungsten nitride layer in the trench structure, subjecting the substrate to a nitridation treatment using active nitrogen species from a remote plasma, and depositing a tungsten bulk layer directly on the tungsten nitride layer without depositing a tungsten nucleation layer on the tungsten nitride layer as a growth site for tungsten.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide a method and an integrated film stacks for contact plugs, buried word lines used in DRAM, or other logic device applications requiring a contact barrier or metal electrodes having feature size less than 40 nm. In various embodiments of the present invention, a halogen-free MOCVD or MOALD process is used to deposit an integrated WN, WN/WN($W_{rich}$), or WN/WN($W_{pure}$) film stack, which may serve as a strong barrier to prevent the underlying region from fluorine penetration during subsequent gate metallization process. Prior to the deposition of the film stack on the substrate, a silicon containing gas soak process may be performed to form a thin silicon containing layer on the substrate to efficiently improve adhesion between the substrate and the film stack formed thereon. In one embodiment, the silicon containing gas used to perform the soak process is a silane gas. It is noted that the silicon containing gas soak process may also be performed between the formation of layers in the film stack, or during formation of the layers formed in the film stack.

The integrated film stacks of the present invention can achieve a good adhesion between the substrate and the film stack containing the barrier layer and metal electrodes/metal contacts, satisfying advanced gate/contact structure requirements for low resistivity films and good adhesion at the interface.

Buried Word Line Applications

Figures 1A, 1B, 1C:
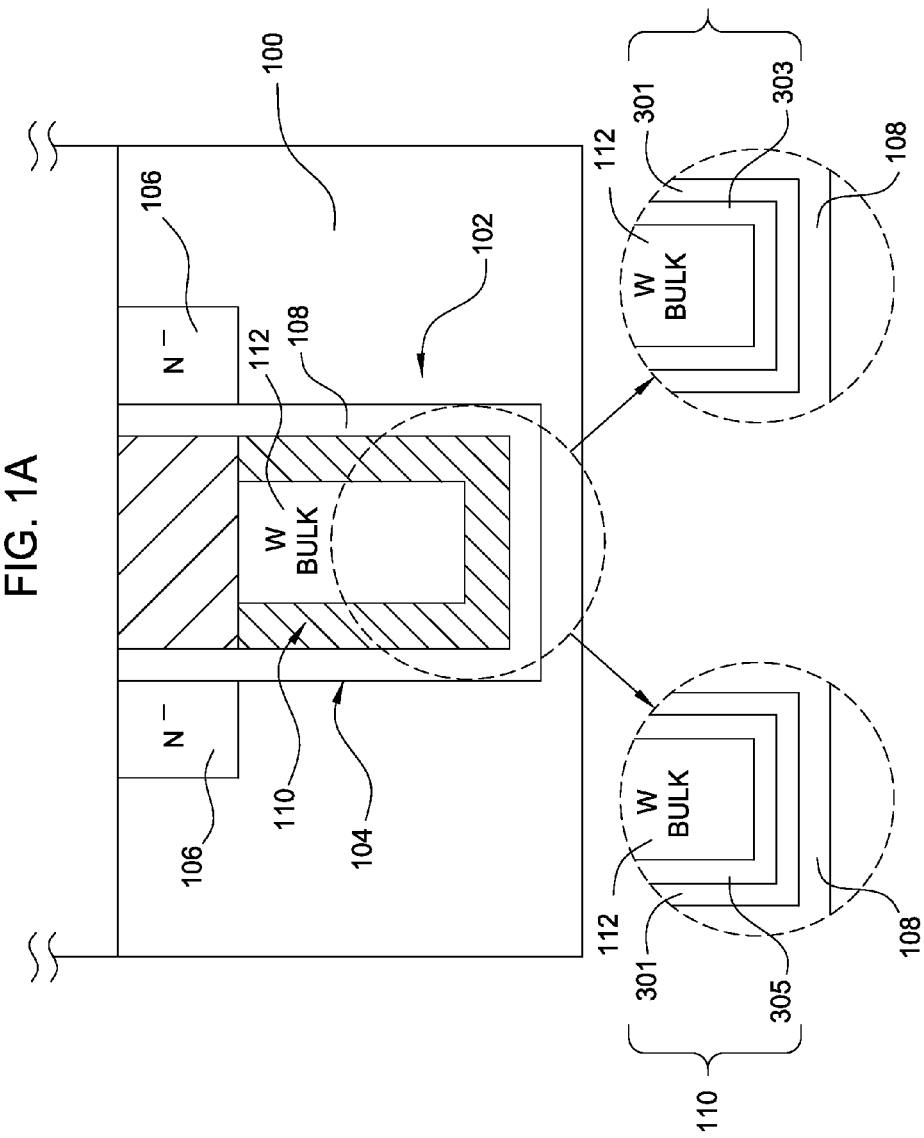
FIGS. 1A-1C illustrate a cross-sectional view of an exemplary film stack used in a buried word line (bWL) feature of DRAM according to embodiments of the present invention.
Figure 2:
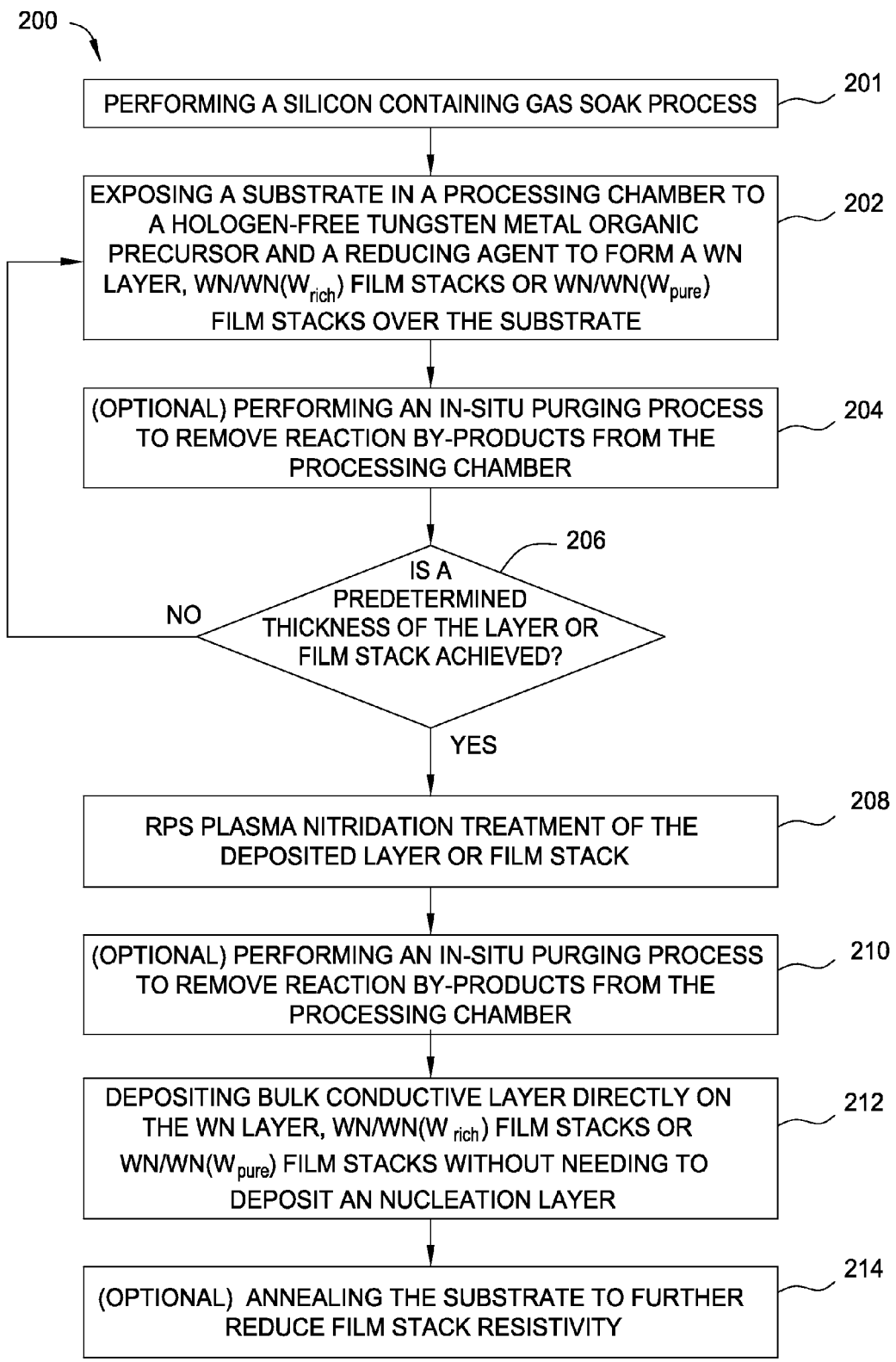
FIG. 2 illustrates a process sequence used to form a buried word line feature as shown in FIGS. 1A-1C, contact vias, or any other logic device applications requiring a barrier/liner structure.

FIG. 1A illustrates a cross-sectional view of a dynamic random access memory (DRAM) capacitor showing an exemplary buried word line (bWL) feature 100 according to the present invention. The steps for fabricating the buried wordline feature 100 are illustrated in FIG. 2 and will be discussed below. For clarity, other features, such as bit lines or capacitor, etc., are omitted and should be appreciated by a person having ordinary skill in the art.

As shown in FIG. 1A, a vertical opening or trench 104 eventually housing the buried word line is formed into a silicon or any other suitable substrate 102 with the aid of a conventional trench mask (not shown). An ion implantation or other suitable techniques may be used to provide an adequate N⁻ region 106 next to the trench 104 on the substrate surface. The trench 104 is generally formed in a high aspect ratio trench structure, such as an aspect ratio exceeding 4:1 or 10:1. The trench can, for example, have an elongated or rectangular cross section and a diameter or side length which can vary over a wide range, for example, from about 20 nm to about 200 nm. While not shown here, it is contemplated that the shape of the trench structure could be oval, circular, square, or any other configuration. Once the trench has been etched in the substrate 102, a gate oxide layer 108 is formed over sidewalls and a bottom of the trench 104 as shown. In various examples, the trench 104 is clad with the gate oxide layer 108 such as silicon dioxide, silicon oxide, or silicon nitride, or other high-k dielectric materials by an oxidation process.

After the gate oxide layer 108 has been deposited over the surfaces of the trench 104, the trench 104 is filled with an integrated layer 110 which covers the exposed surfaces of the gate oxide layer 108. The trench 104 may be etched back to a desired depth such that a thin integrated layer 110 is blanket deposited over the gate oxide layer 108. The integrated layer 110 is believed to protect the underlying region from fluorine attack during subsequent bulk W deposition while improving the interlayer adhesion between the gate oxide layer 108 and the subsequently deposited conductive metal layer (e.g., bulk W 112). In one embodiment, the integrated layer 110 is a thin low-resistivity tungsten nitride (WN) layer. In other embodiments as shown in FIGS. 1B and 1C and will be discussed below, a low-resistivity WN/WN($W_{rich}$) or WN/WN($W_{pure}$) film stack, instead of the WN single layer, may be used as the integrated layer 110.

Thereafter, the trench 104 is filled with a metal or other conductive material that is suitable as gate material, such as titanium, tungsten, copper, cobalt, ruthenium, nickel, platinum, aluminum, silver, polysilicon, doped polysilicon, derivatives thereof, alloys thereof, and combinations thereof. The trench 104 is filled with bulk W 112 by a CVD method. The trench 104 is then etched back until the top of the conductive material resides beneath the top surface of the substrate 100 to a desired depth. The recessed gap area in the trench 104 is then filled with dielectric materials (e.g., oxide, nitride or oxynitride) and the top trench surface portions is planarized by a suitable technique, forming the buried word line feature 100 for the DRAM devices if appropriately doped. A dielectric layer may be deposited on the planarized trench surface to build up upper interconnections.

Prior to the deposition of the integrated layer 110, a silicon containing gas soak process may be performed on the gate oxide layer 108. As the integrated layer 110 is formed by a metal containing layer, such as tungsten containing layer (e.g., W metal or WN) as described above, poor interface adhesion is often found as the metal containing layer often has poor adhesion to a dielectric layer. Therefore, a silicon containing gas soak process is performed to form a thin silicon containing layer on the gate oxide layer 108. The silicon containing gas may later react with the metal elements from the integrated layer 110 to form a metal silicide over the gate oxide layer 108. The silicon atoms from the silicon containing gas are adhered and absorbed on the interface between the gate oxide layer 108 and metal elements from the integrated layer 110, thereby forming a metal silicide layer improving the adhesion at the interface.

In one embodiment, as discussed above, as the integrated layer 110 may have a tungsten nitride (WN) formed in direct contact with the gate dielectric layer 108, a Si—WN layer may be formed at the interface to assist promoting adhesion between the gate dielectric layer 108 and the integrated layer 110.

It is noted that the silicon containing gas soak process may be performed before the integrated layer deposition process, between the formation of the film stack formation process to manufacture the integrated layer 110, or after the manufacture of the integrated layer process.

In one embodiment, as discussed above, the integrated layer 110 may be a single tungsten nitride (WN) film as shown in FIG. 1A or a bilayer of, for example, WN/WN ($W_{rich}$) film stacks comprising a tungsten nitride (WN) layer 301 and a thin tungsten rich tungsten nitride WN($W_{rich}$) layer 303 formed at the surface thereof (FIG. 1B), or WN/WN ($W_{pure}$) film stacks comprising a tungsten nitride (WN) layer 301 and a thin tungsten pure tungsten nitride WN($W_{pure}$) layer 305 formed at the surface thereof, as shown in FIG. 1C.

FIG. 2 illustrates a process sequence 200 used to form the buried word line feature as shown in FIGS. 1B and 1C, contact vias (not shown), or any other logic device applications requiring a barrier/liner structure. The sequence found in FIG. 2 corresponds to the stages depicted in FIGS. 3A-3d, which are discussed herein. It should be noted that the number and sequence of steps illustrated in FIG. 2 are for illustrative purposes only and are not intended to limiting as to the scope of the invention described herein, since one or more steps can be added, deleted and/or reordered without deviating from the basic scope of the invention described herein.

Figure 3C:
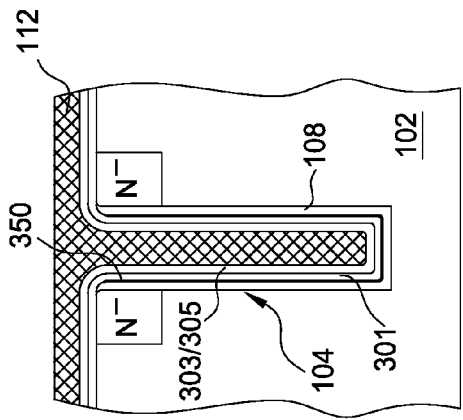
FIGS. 3A-3D illustrate cross-sectional views of a buried word line feature at different stages of fabrication sequence according to the sequence shown in FIG. 2.
Figure 3B:
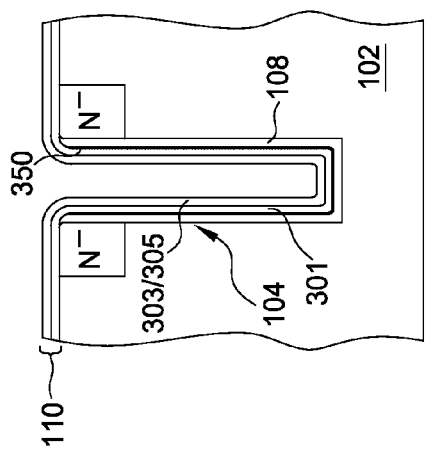
Figure 3A:
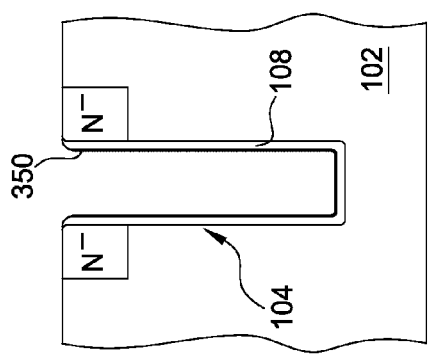

In preliminary step 201, a silicon containing gas soak process is performed to form a thin silicon containing layer 350 on the substrate, as shown in FIG. 3A. The gate oxide layer 108 may be an insulation layer such as silicon dioxide, silicon oxide, silicon nitride, or other high-k dielectric materials. The thin silicon containing layer 350 formed on the substrate may later react with the integrated layer 110, which will be described below in detail, forming a metal silicide layer so as to improve the adhesion at the interface. In one embodiment, examples of the silicon containing gas used to soak the substrate include $SiH_4$, $Si_2H_6$, derivatives thereof, and the like. In one embodiment, the process may be performed by maintaining a substrate temperature at between about 200 degrees Celsius and about 800 degrees Celsius. The process pressure may be maintained at between about 0.05 Torr to about 500 Torr. The deposition time may be controlled at between about 0.1 seconds to 10 minutes. The silicon containing gas flow rate may be controlled at between about 1 sccm to about 10 slm by volume.

In step 202, the integrated layer 110 is deposited utilizing chemical vapor deposition techniques, such as by a metal organic chemical vapor deposition (MOCVD) technique, to form thin, conformal layers over the gate oxide layer 108 that has been formed within the trench 104 (FIGS. 3A and 3B). The integrated layer 110 may be deposited by an atomic layer deposition (ALD) process, preferably, a metal organic atomic layer deposition (MOALD) process. It is contemplated that other suitable processes such as a physical vapor deposition (PVD) or a plasma-enhanced CVD (PECVD) process may be used, depending upon the application. In one embodiment as shown in FIG. 3B, the integrated layer 110 is a low-resistivity bilayer, such as a film stack comprising a tungsten nitride (WN) layer 301 and a thin tungsten rich layer formed at an upper surface thereof. It is noted that the silicon containing gas soak process, as described at step 201, may be performed between the tungsten nitride (WN) layer 301 and a thin tungsten rich layer formed at the upper surface. Alternatively, the silicon containing gas soak process, as described at step 201, may be repeatedly performed when the thickness of the tungsten nitride (WN) layer 301 is grown every 10 Å to 20 Å as needed.

The tungsten rich layer may comprise a mixture of metallic tungsten and at least one tungsten compound, such as tungsten nitride. In one example, the tungsten rich layer is a tungsten rich tungsten nitride WN($W_{rich}$) layer 303 as shown. The tungsten rich tungsten nitride layer may contain about 50% to about 90% tungsten and about 10% to about 50% nitrogen. Depending on the precursor and deposition conditions, the film may also contain oxygen or other elements. In another embodiment shown in FIG. 1C, the integrated layer 110 is a low-resistivity bilayer, such as a film stack comprising a tungsten nitride (WN) layer 301 and a thin tungsten pure layer formed at an upper surface thereof. The tungsten pure layer may comprises a mixture of metallic tungsten and at least one tungsten compound, such as tungsten nitride. In one example, the tungsten pure layer is a tungsten nitride WN($W_{pure}$) layer 305. The tungsten pure tungsten nitride layer may contain about 90% to about 100% tungsten and about 0% to about 10% nitrogen.

It is noted that the silicon containing gas soak process, as described at step 201, may be performed between the manufacture of the tungsten nitride (WN) layer 301, the thin tungsten rich layer 303 and the tungsten pure layer 305 as needed. Alternatively, the silicon containing gas soak process, as described at step 201, may also be performed any time during the manufacture of the tungsten nitride (WN) layer 301, the thin tungsten rich layer 303 and the tungsten pure layer 305 as needed.

The low-resistivity WN/WN($W_{rich}$) or WN/WN($W_{rich}$) film stack may serve as a barrier film to protect the underlying region from fluorine attack during subsequent bulk W deposition using $WF_6$ and $H_2$ precursors (or any precursors containing fluorine). While not wishing to be bounded by any particular theory, it is believed that the thin tungsten rich tungsten nitride WN($W_{rich}$) layer or tungsten pure tungsten nitride WN($W_{pure}$) layer formed at the surface of the WN layer can act as a growth site for subsequent bulk tungsten deposition. Therefore, there is no need to deposit a high resistive nucleation layer prior to deposition of the bulk W, which would otherwise be required in the conventional gate electrode using TiN as a barrier film, thereby improving the overall throughput. Skipping the high resistivity nucleation layer (~150 μΩ-cm) will also reduce the film stack resistivity and provide more space for the subsequent low resistive bulk W material in the trench, which is particularly desirable when the feature size is smaller than 40 nm or 30 nm. Furthermore, since the traditional TiN liner/barrier is not used here, there is no concern of halide elements such as Cl (in CVD-TiN using $TiCl_4$ precursor) being diffused into the device during subsequent thermal processing that would adversely increase resistivity of the film.

In the embodiment where the integrated layer 110 is deposited by the MOCVD process, a tungsten metal organic precursor and a reducing agent, for example, nitrogen-containing precursor, may be introduced into the remote plasma source and/or to the processing chamber to form a conformal WN/WN($W_{rich}$) or WN/WN($W_{pure}$) bilayer covering the exposed surface of the gate oxide layer 108. The processing chamber is maintained at a pressure and the substrate is maintained at a temperature suitable for depositing tungsten nitride film onto the substrate. In certain embodiments, it is advantageous that the tungsten precursor is halogen-free metal organic compound so as to prevent the underlying layer from, for example, fluorine attack or contamination during the deposition. In one example, the metal organic compound used to form the WN, WN/WN($W_{rich}$), or WN/WN($W_{pure}$) film stack may include, but is not limited to, tungsten carbonyl (W(CO)$_6$), (tBuN=)$_2$W(NMe$_2$)$_2$, (tBuN=)$_2$W(NEtMe)$_2$, (tBuN=)$_2$W(HNMe)$_2$, W(OEt)$_6$, W(OnPr)$_6$, W(Cp)$_2$H$_2$, W(EtCP)$_2$H$_2$, W(iPrCp)$_2$H$_2$, W(NEt$_2$)$_2$(NEt)$_2$, or derivatives thereof. For WN/WN($W_{rich}$) or WN/WN($W_{pure}$) film stacks, the same or two different tungsten precursors may be used for WN, and for WN($W_{rich}$) or WN($W_{pure}$) portion, respectively. It is contemplated that a carrier gas such as argon (Ar), helium (He), or hydrogen (H$_2$) may be used along with the tungsten metal organic precursor at a desired flow rate. When two different precursors are used, the processing chamber may be equipped with two ampoules for WN, and for WN($W_{rich}$) or WN($W_{pure}$) layer deposition, respectively, without the need to transfer the substrate to another chamber or processing tool. This in-situ WN and W processing ensures film purity and process control, enabling higher productivity and excellent particle performance. Although not mentioned here, in certain embodiments other tungsten-containing compounds such as tungsten carbide may also be used as the base for film stacks.

Suitable nitrogen-containing precursors may include, but are not limited to nitrogen (N$_2$), nitrous oxide (N$_2$O), ammonia (NH$_3$), or the like. The tungsten rich tungsten nitride WN($W_{rich}$) layer or the tungsten pure tungsten nitride WN($W_{pure}$) layer may be obtained by lowering the concentration of the nitrating reactant gas such as nitrogen (N$_2$) in the gas mixture to less than about 50% or about 0% during the deposition process. In certain embodiments, the WN layer may have at least 70 atomic percent tungsten at an upper surface of the layer to form the tungsten rich tungsten nitride WN($W_{rich}$) layer. In one example, the WN layer may have about 90 atomic percent tungsten at an upper surface of the layer to form the tungsten rich tungsten nitride WN($W_{rich}$) layer. Depending upon the application, the W:WN (molecular) ratio for the tungsten rich tungsten nitride WN($W_{rich}$) layer may be between about 2:1 to about 6:1, for example, about 8:1. In another example, the WN layer may have almost 90 to 100 atomic percent tungsten at an upper surface of the layer to form the tungsten pure tungsten nitride WN($W_{pure}$) layer. Depending upon the application, the W:WN (molecular) ratio for the tungsten pure tungsten nitride layer may be between about 9:1 to about 12:1 or about 10:1 to about 100:1. In certain examples, the W:WN (molecular) ratio for the tungsten pure tungsten nitride layer may be higher than 100:1, for example, 200:1. While not discussed here, it is contemplated that WN film property or resistivity can be tuned by doping, or changing N/W ratio, pressure, temperature, or applied power for plasma treatment. In addition, although the tungsten rich or tungsten pure tungsten nitride has been discussed here, it is contemplated that other atomic percentages may be used depending upon the application. For example, in certain examples this thin tungsten nitride portion may have about 5 atomic percent nitrogen to about 95 atomic percent nitrogen and have about 95 atomic percent tungsten to about 5 atomic percent tungsten.

Generally, the deposition chamber during the MOCVD process has an internal pressure of less than 760 Torr, preferably, less than about 100 Torr, such as within a range from about 1 Torr to about 10 Torr. The substrate may have a temperature within a range from about 250° C. to about 600° C., for example from about 400° C. to about 550° C. In one embodiment, the tungsten precursor is introduced into the processing chamber for about 2 seconds to 60 seconds with a chamber pressure maintained at about 5 Torr.

In step 204, an optional in-situ purging process may be performed to remove the residual reactant gases as well as any reaction by-products from the processing chamber. Typically, the purge gas may be one or more gases selected from the group of argon (Ar), nitrogen ($N_2$), helium (He), neon (Ne), and xenon (Xe), among others. The processing chamber may be purged by providing thereto a purge gas at a flow rate of about 5 sccm to about 10,000 sccm, for about 1 second to about 10 seconds.

Depending on specific device requirements, the step 202 or steps 202-204 may be repeated until a desired thickness for the integrated layer 110 is achieved, as shown in step 206. In one example, the WN film deposited by the MOCVD process has a growth rate of 2-3 Å/cycle. In addition to varying processing parameters described above to deposit the integrated layer 110 according to specific applications, one of ordinary skill in the art will appreciate that other parameters, such as flow rate, pressure, temperature, and power for plasma treatment, etc., may be adjusted depending upon the type of precursor or the chamber and/or volume utilized.

In step 208, the deposited film stacks may be subjected to a plasma nitridation treatment using nitrogen species such as $N_2$, $NH_3$, $NF_3$, or the like from an in-situ or remote plasma, to densify the deposited layer and reduce the concentration of organic contaminants. If desired, Ar may be added to sustain plasma in a desired range of power. It has been observed that the WN/WN($W_{rich}$) or WN/WN($W_{pure}$) film stack after plasma nitridation treatment can achieve void free (>90% step coverage) of high aspect ratio features, thereby conformally covering the exposed surface of the gate oxide layer 108. In order to minimize damage to the film property of the device feature, it is preferable to form the plasma by a method that minimizes electric fields at the substrate position, i.e., the plasma is formed in a separate chamber from the processing chamber that holds the substrate, or else the plasma is formed in a separate region of a common chamber such that the plasma body is a substantial distance from the substrate. In various embodiments, the reactive nitrogen species may be generated using a inductively or capacitively coupled remote plasma source connected to the processing chamber, at an input plasma power between about 25 watts and about 10,000 watts at a desired frequency, a process pressure at about 1 Torr to about 100 Torr, and a duration of about 2 seconds to about 90 seconds.

In step 210, an optional in-situ purging process may be performed again to remove the residual reactant gases as well as any reaction by-products from the processing chamber. As discussed previously, the purge gas may be one or more gases selected from the group of argon (Ar), nitrogen ($N_2$), helium (He), neon (Ne), and xenon (Xe), among others. The processing chamber may be purged by providing thereto a purge gas at a flow rate of about 5 sccm to about 10,000 sccm, for about 1 second to about 10 seconds.

In the embodiments shown in FIGS. 1B and 1C, the tungsten nitride (WN) layer 301 may be formed to a thickness between about 5 Å to about 100 Å for a feature having an aperture width less than about 0.25 μm and an aspect ratio greater than about 5:1. In one example, the tungsten nitride (WN) layer 301 is deposited to a thickness between about 20 Å to about 60 Å. In certain embodiments, the tungsten rich tungsten nitride layer WN($W_{rich}$) 303 or the tungsten pure tungsten nitride layer WN($W_{pure}$) 305 may be formed to a thickness between about 5 Å to about 100 Å.

Figure 3D:
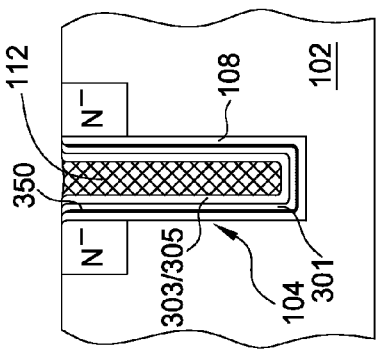

In step 212, after the desired thickness of the integrated layer 110 has been deposited over the exposed surfaces of the gate oxide layer 108, the trench 104 is etched back to a desired depth and filled with a bulk metal or other conductive material that is suitable as gate material, as shown in FIG. 3C. A planarizing process is then performed on the substrate surface, forming the buried word line feature 100 of the DRAM device, as shown in FIG. 3d. The conductive material may include, but is not limited to titanium, tungsten, copper, cobalt, ruthenium, nickel, platinum, aluminum, silver, polysilicon, doped polysilicon, derivatives thereof, alloys thereof, and combinations thereof. In one example, the gate material is a bulk tungsten (W) layer 112 formed by CVD, PVD, ALD, ECP (electrochemical plating), or electroless deposition process. In one aspect where tungsten is used as the bulk conductive layer, the bulk tungsten layer may be deposited by reacting a tungsten-containing precursor such as tungsten hexafluoride ($WF_6$) with hydrogen ($H_2$), and optionally argon or $N_2$ on the substrate. The processing time of the bulk W deposition depends on the desired thickness of the bulk W layer. In one example, the bulk W deposition only requires a very short process time of less than 1 minute per chamber for less than 1000 Å film deposition. In one embodiment, the bulk W layer 112 is deposited to a thickness between about 60 Å to about 1,000 Å. In one example, the bulk W layer 112 is deposited to a thickness about 90 Å. The chamber pressure during the deposition may be maintained between about 5 Torr and 760 Torr while the pedestal temperature is set to between about 40° C. and about 550° C.

As tungsten is a relatively low resistance metal, the resulting film stacks is able to provide a reduced resistivity of about 95 μΩ-cm at 100 Å with nucleation free CVD W (bulk W) formed on 30 Å WN film. The film stack formed according to embodiments described herein has been able to provide a resistivity that is less than about 700 μΩ-cm for $W_{rich}$ WN and about 2,000 μΩ-cm for WN, and has better electrical properties than interconnects of the prior art, which are particularly useful for making memory and logic structures for use with the fabrication of integrated circuits.

In step 214, the substrate having the resulting film stack may be optionally exposed to a thermal annealing process in an annealing chamber after step 212 to further reduce the film resistivity. Additionally or alternatively, this annealing step may be performed after the desired thickness of the integrated layer 110 has been deposited over the surfaces of the trench 104, i.e., the step 202. The substrate may be heated to a temperature within a range from about 400° C. to about 1,000° C. In one example, the substrate is heated to a temperature from about 600° C. to about 1,000° C. during the thermal annealing process. The thermal annealing process may occur for a time period within a range between about 10 seconds to about 120 minutes, for example, from about 1 minute to about 60 minutes. In one example, the substrate may be heated at about 900° C. for about 1 minute during the thermal annealing process.

In an alternative embodiment, substrate may be transferred into a rapid thermal processing (RTP) chamber and exposed to an RTP annealing process after step 202 or 212. The CENTURA® RADIANCE® RTP chamber, available from Applied Materials, Inc., located in Santa Clara, Calif., may be used during the RTP process. The annealing chamber may be on the same cluster tool as the deposition chambers so that substrate may be annealed without being exposed to the ambient environment. The substrate may be heated to a temperature within a range from about 600° C. to about 1,000° C., for example, from about 700° C. to about 900° C. during the RTP annealing process. The substrate may be exposed to the RTP process for a time period within a range from about 15 seconds to about 10 minutes, for example, from about 30 seconds to about 5 minutes, or from about 1 minute to about 4 minutes.

With the post thermal annealing process, it has been found that the film stack resistivity of the integrated layer 110 (e.g., WN, WN/WN($W_{rich}$), or WN/WN($W_{pure}$)) is further dropped from about 700-2,000 $\mu\Omega$-cm to about 90 $\mu\Omega$-cm. It has been also found that the post thermal annealing process can further reduce the film stack resistivity from 95 $\mu\Omega$-cm to about 50 $\mu\Omega$-cm or as low as about 34 $\mu\Omega$-cm, with the result of nucleation-free bulk W layer. While not wishing to be bounded by theory, it is believed that C, N, or F is driven out of the surface during the post thermal annealing process, instead of diffusing into the $SiO_2$ substrate, resulting in the reduced film stack resistivity. Minimizing fluorine content at $WN/SiO_2$ interface is particularly useful since fluorine from the WN film can diffuse into the underlying layers and adversely increases the resistance of those layers.

According to embodiments of the present invention, the bulk W layer 112 has been observed to be able to grow on an integrated layer 110 comprising low-resistivity MOCVD WN, WN/WN($W_{rich}$), or WN/WN($W_{pure}$) film stacks without depositing a nucleation layer as a grow site, as would be required in the conventional gate electrode using TiN as liner/barrier film, and thereby providing more space for subsequent low-resistivity conductive gate materials (e.g., bulk W) to be filled within the buried word lines of the DRAM device. Skipping the high resistivity nucleation layer not only significantly reduces the film resistivity, but also improves the throughput. Furthermore, since the traditional TiN liner/barrier is not used, there is no concern of halide elements such as Cl (in CVD-TiN using $TiCl_4$ precursor) being diffused into the device during subsequent thermal processing that would adversely increase resistivity of the film.

Figure 4A:
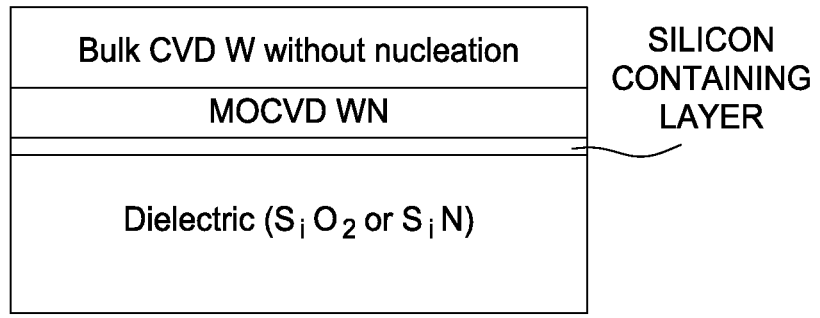
FIGS. 4A and 4B illustrate a cross-sectional view of an exemplary film stack for surface modification applications.
Figure 4B:
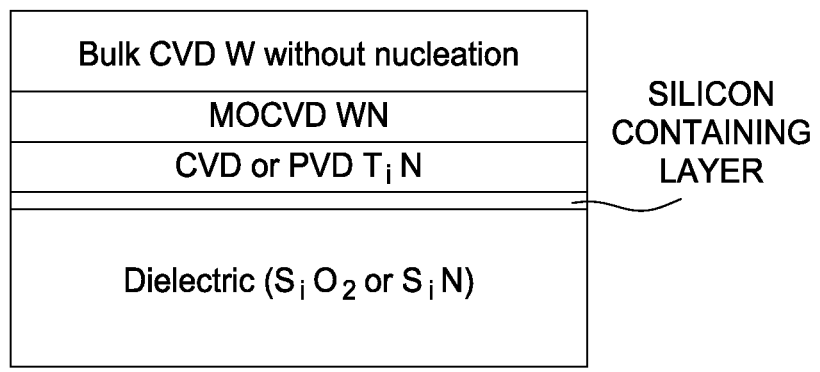

While the foregoing is directed to the buried word line application for DRAM device, the integrated film stacks in accordance with embodiments of the present invention are also applicable to other logic device applications requiring a contact barrier or metal electrodes having feature size less than 40 nm. For example, the low-resistivity integrated barrier/liner layer comprising MOCVD WN, WN/WN($W_{rich}$), or WN/WN($W_{pure}$) film stack may serve as a strong barrier for transistors, buried bit lines, or contact vias to prevent the underlying region from fluorine penetration during subsequent gate metallization process. The integrated WN film stacks of the present invention are beneficial to various processes since it is deposited using a metal organic precursor that is free of fluorine. The integrated WN film stacks also advantageously eliminate the need to deposit a nucleation layer prior to deposition of the W gate metallization since the thin tungsten rich tungsten nitride WN($W_{rich}$) layer or tungsten pure tungsten nitride WN($W_{pure}$) layer formed at the surface of the WN layer can act as a growth site for subsequent gate metallization, satisfying advanced gate structure requirements for low resistivity films with low leakage current problem. As shown in FIGS. 4a and 4b, it is even more surprising to observe that the MOCVD WN film stacks of the instant invention can be a novel surface modification technique for CVD bulk W layer or tungsten wiring process to provide lower resistance and a smoother W surface. The film resistivity has been found to drop to as low as about 34 $\mu\Omega$-cm with nucleation-free thin CVD W having smooth surface morphology, which is believed to be reduced further after an annealing process, as discussed previously. Although MOCVD WN is illustrated in FIGS. 4a and 4b, it is contemplated that a tungsten rich tungsten nitride WN($W_{rich}$) layer or tungsten pure tungsten nitride WN($W_{pure}$) layer may be formed thereon as discussed above.

Although the exemplary embodiment described is about utilizing a tungsten containing metal integrated layer, it is noted that the silicon containing gas soak process, as described at step 201, may be performed prior to any metallization process utilizing different metal barrier layers, including Ti, TiN, Ta, TaN, TaSiN, TiSiN and the like.

Exemplary Hardware

Figure 5:
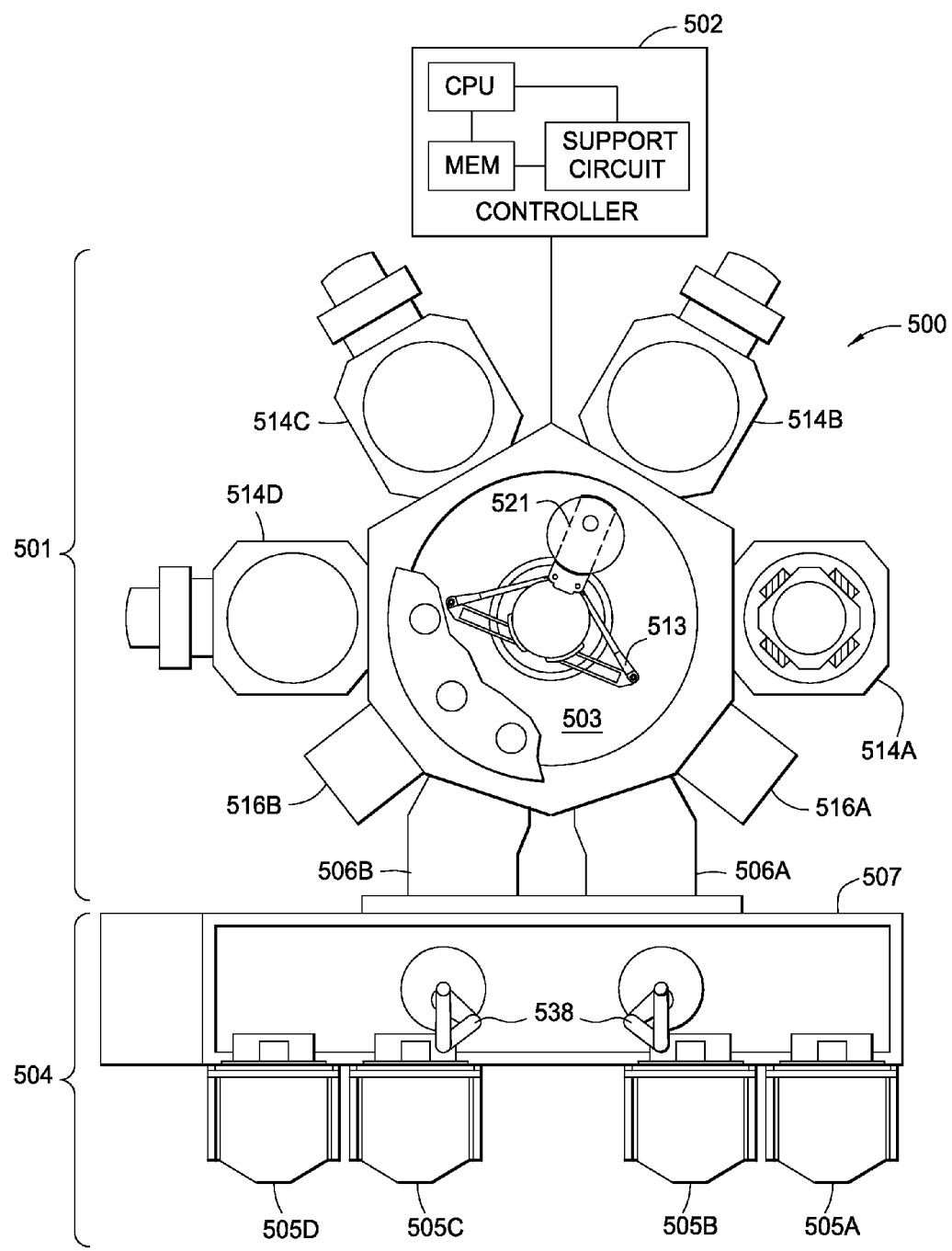
FIG. 5 depicts a schematic plan view of an exemplary integrated semiconductor substrate processing system that may be configured to practice embodiments of the present invention.

FIG. 5 depicts a schematic plan view of an exemplary integrated semiconductor substrate processing system 500 that may be configured to practice embodiments of the present invention as discussed above. Examples of the integrated system 500 show modification of the, CENTURA® integrated tool, available from Applied Materials, Inc., of Santa Clara, Calif. It is contemplated that the methods described herein may be practiced in other tools having the requisite process chambers coupled thereto, such as PRODUCER® and ENDURA® integrated tools, available from Applied Materials, Inc., of Santa Clara, Calif., or tools available from other manufacturers.

The processing system 500 generally includes a vacuum-tight processing platform 501, a factory interface 504, and a system controller 502. The platform 501 comprises a plurality of processing chambers 514A-D and load lock chambers 506A-B, which are coupled to a vacuum substrate transfer chamber 503. The factory interface 504 is coupled to the transfer chamber 503 by the load lock chambers 506A-B. Although there are four process chambers shown in FIG. 5, it is contemplated that the system may have any suitable number of process chambers.

In certain embodiments, the factory interface 504 comprises at least one docking station 507 and at least one factory interface robot 538 to facilitate transfer of substrates. The docking station 507 is configured to accept one or more front opening unified pod (FOUP). Four FOUPs 505A-D are shown in the embodiment of FIG. 5. The factory interface robot 538 is configured to transfer the substrate from the factory interface 504 to the processing platform 501 for processing through the load lock chambers 506A-B.

Each of the load lock chambers 506A-B have a first port coupled to the factory interface 504 and a second port coupled to the transfer chamber 503. The load lock chambers 506A-B are coupled to a pressure control system (not shown) which pumps down and vents the chambers 506A-B to facilitate passing the substrate between the vacuum environment of the transfer chamber 503 and the substantially ambient (e.g., atmospheric) environment of the factory interface 504.

The transfer chamber 503 has a vacuum robot 513 disposed therein. The vacuum robot 513 is capable of transferring substrates 521 between the load lock chamber 506A-B and the processing chambers 514A-D. In certain embodiments, the transfer chamber 503 may include a cool down station built therein to facilitate cooling down the substrate 521 while transferring a substrate 521 in the system 500.

In certain embodiments, the processing chambers 514A-D coupled to the transfer chamber 503 may include chemical vapor deposition (CVD) chambers 514A-B, a plasma chamber 514C (such as a Decoupled Plasma Nitridation (DPN) chamber), and a Rapid Thermal Process (RTP) chamber 514D. The CVD chambers 514A-B may include different types of CVD chambers, such as a thermal chemical vapor deposition (Thermal-CVD) process, low pressure chemical vapor deposition (LPCVD), metal-organic chemical vapor deposition (MOCVD), plasma enhanced chemical vapor deposition (PECVD), sub-atmosphere chemical vapor deposition (SACVD), and the like. Alternatively, different processing chambers, including at least one atomic layer deposition (ALD), CVD, physical vapor deposition (PVD), DPN, or RTP chamber, may be interchangeably incorporated into the system 500 in accordance with process requirements. Suitable ALD, CVD, PVD, DPN, RTP, and MOCVD processing chambers are available from Applied Materials, Inc., among other manufacturers.

In certain embodiments, an optional service chamber (shown as 516A-B) may be coupled to the transfer chamber 503. The service chambers 516A-B may be configured to perform other substrate processes, such as degassing, orientation, pre-cleaning process, cool down, and the like.

The system controller 502 is coupled to the system 500. The system controller 502 controls the operation of the system 500 using a direct control of the process chambers 514A-D of the system 500 or alternatively, by controlling the computers (or controllers) associated with the process chambers 514A-D and system 500. The system controller 502 may comprise a CPU 530, a memory storage device 536, and a support circuit 532. In operation, the system controller 502 enables data collection and feedback from the respective chambers and system 500 to enhance performance of the system 500.

While the foregoing is directed to embodiments of the present invention, other and further embodiments of the invention may be devised without departing from the basic scope thereof, and the scope thereof is determined by the claims that follow.

What is claimed is:

1. A method of forming a film stack on a substrate, comprising:
    performing a silicon containing gas soak process to form a silicon containing layer over the substrate;
    depositing a tungsten nitride layer on the silicon containing layer;
    reacting the silicon containing layer with the tungsten nitride layer to form a tungsten silicide layer at an interface between the tungsten nitride layer and the silicon containing layer;
    subjecting the tungsten nitride layer to a nitridation treatment using active nitrogen species from a remote plasma; and
    depositing a conductive bulk layer directly on the tungsten nitride layer.

2. The method of claim 1, wherein the silicon containing soak gas process comprises exposing the substrate to a silicon containing gas comprising $SiH_4$, $Si_2H_6$ or derivatives thereof.

3. The method of claim 2, wherein the silicon containing gas soak process is performed at a temperature between about 200 degrees Celsius and about 800 degrees Celsius, and at a pressure between about 0.05 Torr to about 500 Torr.

4. The method of claim 3, wherein a flow rate of the silicon containing gas is controlled between about 1 sccm to about 10 slm by volume.

5. The method of claim 1, further comprising:
    annealing the substrate after deposition of the tungsten nitride layer on the substrate and prior to deposition of the conductive bulk layer.

6. The method of claim 1, further comprising:
    annealing the substrate after deposition of the conductive bulk layer.

7. The method of claim 1, wherein the tungsten nitride layer is deposited by exposing the substrate to a gas mixture comprising a halogen-free precursor and a nitrogen containing reducing agent.

8. The method of claim 7, wherein the halogen-free precursor comprises a tungsten metal organic compound selected from the group consisting of tungsten carbonyl ($W(CO)_6$), $(tBuN=)_2W(NMe_2)_2$, $(tBuN=)_2W(NEtMe)_2$, $(tBuN=)_2W(HNMe)_2$, $W(OEt)_6$, $W(OnPr)_6$, $W(Cp)_2H_2$, $W(EtCP)_2H_2$, $W(iPrCp)_2H_2$, $W(NEt_2)_2(NEt)_2$, and derivatives thereof.

9. The method of claim 7, wherein the nitrogen containing reducing agent comprises nitrogen ($N_2$), nitrous oxide ($N_2O$), or ammonia ($NH_3$).

10. The method of claim 1, wherein the tungsten nitride layer further comprises:
    a first tungsten nitride layer; and
    a second thin tungsten rich tungsten nitride layer.

11. The method of claim 10, wherein the second thin tungsten rich tungsten nitride layer contains about 50% to 90% tungsten and about 10% to about 50% nitrogen.

12. The method of claim 1, wherein the tungsten nitride layer further comprises:
    a first tungsten nitride layer; and
    a second thin tungsten pure tungsten nitride layer.

13. The method of claim 12, wherein the second thin tungsten pure tungsten nitride layer contains about 90% to 100% tungsten and about 0% to about 10% nitrogen.

14. The method of claim 1 wherein the conductive bulk layer comprises tungsten.

15. A method of fabricating a buried word line (bWL) feature used in a dynamic random access memory (DRAM), comprising:
    forming a trench structure in a substrate, the trench structure having sidewalls and a bottom;
    soaking the substrate in a silicon containing gas to form a silicon containing layer on the substrate;
    exposing the substrate to a first processing gas comprising nitrogen and a second processing gas comprising a tungsten to deposit a first tungsten nitride layer on the silicon containing layer, wherein a tungsten silicide layer is formed at an interface between the silicon containing layer and the first tungsten nitride layer;
    subjecting the first tungsten nitride layer to a nitridation treatment using active nitrogen species from a remote plasma;
    depositing a second tungsten nitride layer on a surface of the first tungsten nitride layer using a third processing gas comprising nitrogen and a fourth processing gas comprising tungsten; and
    depositing a tungsten bulk layer directly on a surface of the second tungsten nitride layer.

16. The method of claim 15, further comprising:
    annealing the substrate after deposition of the second tungsten nitride layer and prior to deposition of the tungsten bulk layer.

17. The method of claim 15, wherein the second and fourth processing gases comprises a tungsten metal organic compound selected from the group consisting of tungsten carbonyl ($W(CO)_6$), $(tBuN=)_2W(NMe_2)_2$, $(tBuN=)_2W(NEtMe)_2$, $(tBuN=)_2W(HNMe)_2$, $W(OEt)_6$, $W(OnPr)_6$, $W(Cp)_2H_2$, $W(EtCP)_2H_2$, $W(iPrCp)_2H_2$, $W(NEt_2)_2(NEt)_2$, and derivatives thereof.

* * * * *